(12) United States Patent
Park et al.

(10) Patent No.: US 9,448,476 B2
(45) Date of Patent: Sep. 20, 2016

(54) PHOTORESIST COMPOSITION AND METHOD OF MANUFACTURING A THIN FILM TRANSISTOR SUBSTRATE

(71) Applicant: SAMSUNG DISPLAY CO., LTD., Yongin, Gyeonggi-Do (KR)

(72) Inventors: Sung-Kyun Park, Suwon-si (KR); Jeong-Min Park, Seoul (KR); Jung-Soo Lee, Seoul (KR); Ji-Hyun Kim, Suwon-si (KR); Jun Chun, Yongin-si (KR); Ki-Hyun Cho, Suwon-si (KR); Hyoc-Min Youn, Hwaseong-si (KR); Tai-Hoon Yeo, Hwaseong-si (KR); Jin-Sun Kim, Hwaseong-si (KR); Byung-Uk Kim, Hwaseong-si (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 14/522,771

(22) Filed: Oct. 24, 2014

(65) Prior Publication Data
US 2015/0212411 A1    Jul. 30, 2015

(30) Foreign Application Priority Data
Jan. 24, 2014  (KR) .................. 10-2014-0008826

(51) Int. Cl.
| | | |
|---|---|---|
| G03F 7/30 | (2006.01) | |
| G03F 7/033 | (2006.01) | |
| G03F 7/028 | (2006.01) | |
| H01L 21/02 | (2006.01) | |
| H01L 21/312 | (2006.01) | |
| G03F 7/038 | (2006.01) | |
| H01L 21/311 | (2006.01) | |

(52) U.S. Cl.
CPC ............... *G03F 7/038* (2013.01); *G03F 7/028* (2013.01); *G03F 7/033* (2013.01); *G03F 7/30* (2013.01); *H01L 21/02112* (2013.01); *H01L 21/02118* (2013.01); *H01L 21/311* (2013.01)

(58) Field of Classification Search
None
See application file for complete search history.

(56) References Cited

U.S. PATENT DOCUMENTS

| | | | | |
|---|---|---|---|---|
| 4,383,903 A | * | 5/1983 | Ayano ................... | C08F 2/20 430/196 |
| 2003/0109747 A1 | | 6/2003 | Yamaguchi et al. | |
| 2005/0215752 A1 | * | 9/2005 | Popp ...................... | A61L 15/60 528/272 |
| 2011/0104500 A1 | * | 5/2011 | Southwell .............. | C08G 65/18 428/413 |
| 2011/0124824 A1 | * | 5/2011 | Nagata ................... | C08F 2/44 525/451 |
| 2012/0141937 A1 | * | 6/2012 | Lin ......................... | G03F 7/033 430/281.1 |
| 2012/0257283 A1 | * | 10/2012 | Maruyama .......... | B01F 17/0007 359/619 |

(Continued)

FOREIGN PATENT DOCUMENTS

| | | | |
|---|---|---|---|
| EP | 2204677 | * | 7/2010 |
| JP | 2009-244736 | * | 10/2009 |

(Continued)

OTHER PUBLICATIONS

Machine translation of JP 2009-244736 (Oct. 2009).*

*Primary Examiner* — Martin Angebranndt
(74) *Attorney, Agent, or Firm* — Lee & Morse, P.C.

(57) ABSTRACT

A photoresist composition includes about 0.1 to about 30 parts by weight of a photo-initiator, about 1 to 50 parts by weight of a first acrylate monomer including at least five functional groups, about 1 to 50 parts by weight of a second acrylate monomer including at most four functional groups with respect to about 100 parts by weight of an acryl-copolymer.

20 Claims, 3 Drawing Sheets

(56) References Cited

U.S. PATENT DOCUMENTS

2014/0212809 A1* 7/2014 Park .................. G03F 7/038
                                                                 430/280.1
2014/0246633 A1* 9/2014 Hsu .................. G03C 1/733
                                                                  252/586

FOREIGN PATENT DOCUMENTS

| KR | 10-2008-0052865 A | 6/2008 |
| --- | --- | --- |
| KR | 10-2009-0072291 A | 7/2009 |
| KR | 10-2011-0072813 A | 6/2011 |
| KR | 10-2013-0062054 A | 6/2013 |

* cited by examiner

PHOTORESIST COMPOSITION AND METHOD OF MANUFACTURING A THIN FILM TRANSISTOR SUBSTRATE

CROSS-REFERENCE TO RELATED APPLICATION

Korean Patent Application No. 10-2014-0008826, filed on Jan. 24, 2014, in the Korean Intellectual Property Office, and entitled: "Photoresist Composition And Method Of Manufacturing A Thin Film Transistor Substrate," is incorporated by reference herein in its entirety.

BACKGROUND

1. Field

Embodiments relate to a photoresist composition. More particularly, embodiments relate to a photoresist composition to form an insulation layer for a display device, and a method of manufacturing a thin film transistor substrate using the photoresist composition.

2. Description of the Related Art

Generally, a display substrate that is used for a display device includes a thin film transistor that serves as a switching element for driving a pixel unit, a signal line connected to the thin film transistor, and a pixel electrode. The signal line includes a gate line providing a gate signal, and a data line crossing the gate line and providing a data signal.

The display substrate may include an organic insulation layer for insulating electrodes and lines or for flattening a substrate. For example, the display substrate may include an organic insulation layer covering the thin film transistor. The pixel electrode may be connected to the drain electrode through a contact hole formed through the organic insulation layer.

SUMMARY

Embodiments are directed to a photoresist composition including about 100 parts by weight of an acryl-copolymer, about 0.1 to about 30 parts by weight of a photo-initiator, about 1 to about 50 parts by weight of a first acrylate monomer including at least five functional groups, and about 1 to about 50 parts by weight of a second acrylate monomer including at most four functional groups, the second acrylate monomer being at least one selected from the group of compounds represented by the following Chemical Formulas 1 to 5, <Chemical Formula 1>

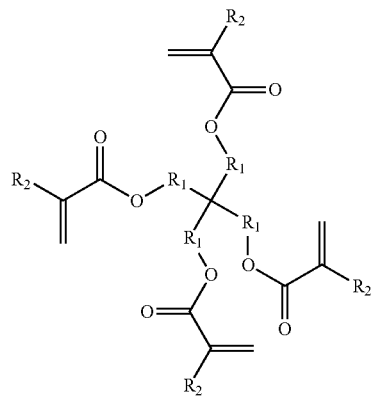

wherein in Chemical Formula 1, $R_1$ independently represents a C2-C10 alkylene group or a C2-C10 oxyalkylene group, and $R_2$ independently represents a hydrogen atom or a C1-C10 alkyl group, <Chemical Formula 2>

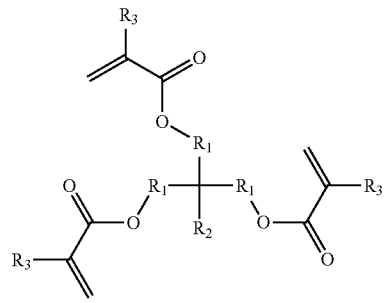

wherein, in Chemical Formula 2, $R_1$ independently represents a C1-C10 alkylene group or C1-C10 oxyalkylene or polyoxyalkylene group, $R_2$ represents a hydroxymethyl group, a C3-C10 alkyl group or C3-C10 alkoxy group, and $R_3$ independently represents a hydrogen atom or a C1-C10 alkyl group, <Chemical Formula 3>

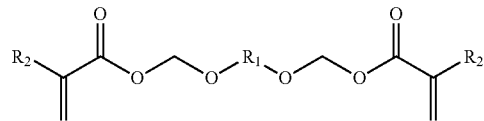

wherein, in Chemical Formula 3, $R_1$ represents a phenylene group, a tricyclodecylene group, an adamantylene group, a norboranylene group, a bisphenol-A group or a bisphenol-F group, and $R_2$ independently represents a hydrogen atom or an alkyl group having carbon atoms of 1 to 10, in Chemical Formula 3, <Chemical Formula 4>

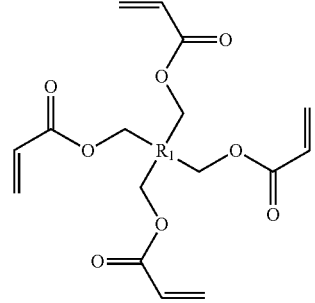

wherein, in Chemical Formula 4, $R_1$ represents a C2-C20 dialkyl ether group,

<Chemical Formula 5>

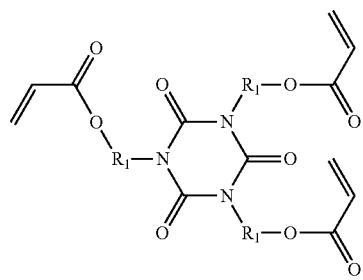

wherein, in Chemical Formula 5, $R_1$ independently represents a C1-C10 alkylene group or a C1-C10 oxyalkylene group.

The photoresist composition may further include a solvent such that a solid content of the photoresist composition is about 10 to about 50% by weight.

The acryl-copolymer may be prepared by copolymerizing monomers including an unsaturated olefin compound and an unsaturated carboxylic acid through a radical polymerizing reaction.

A weight average molecular weight of the acryl-copolymer may be about 3,000 to about 30,000.

The first acrylate monomer may include at least one selected from the group of dipentaerythritol hexaacrylate, dipentaerythritol pentaacrylate, dipentaerythritol hydroxypentaacrylate, dipentaerythritol alkyloylpentaacrylate, and caprolactam-substituted dipentaerythritol hexaacrylate.

The second acrylate monomer may include at least one selected from the group of compounds represented by the following Chemical Formulas 6 to 11.

<Chemical Formula 6>

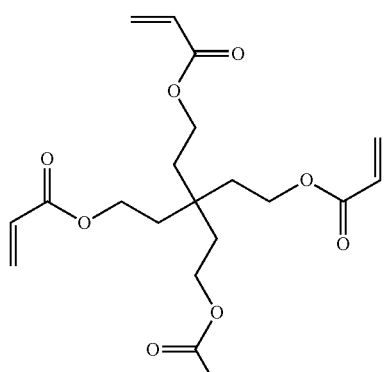

<Chemical Formula 7>

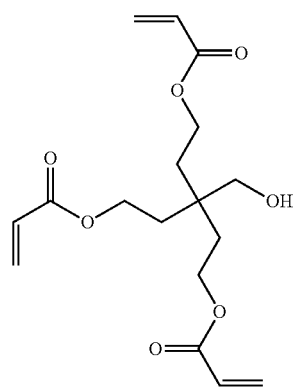

<Chemical Formula 8>

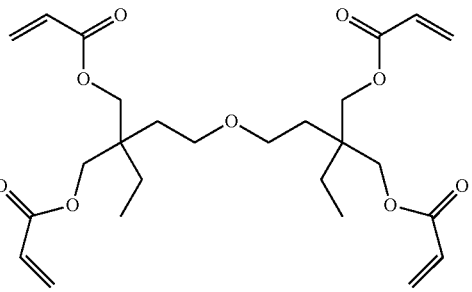

<Chemical Formula 9>

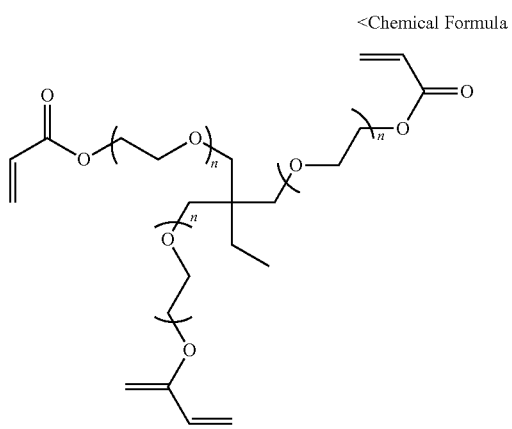

wherein, in Chemical Formula 9, n represents an integer of 1 to 3 in Chemical Formula 9, <Chemical Formula 10>

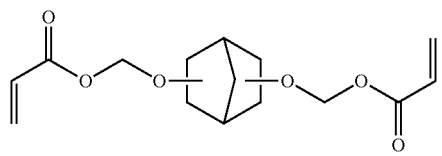

<Chemical Formula 11>

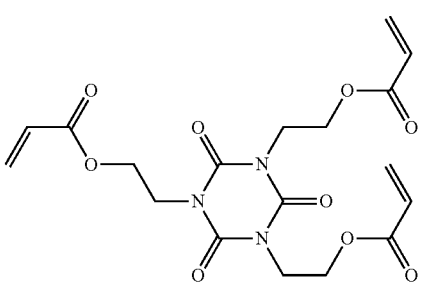

The photo-initiator may include an oxime-ester compound.

The photo-initiator may include a compound represented by the following Chemical Formula 12.

<Chemical Formula 12>

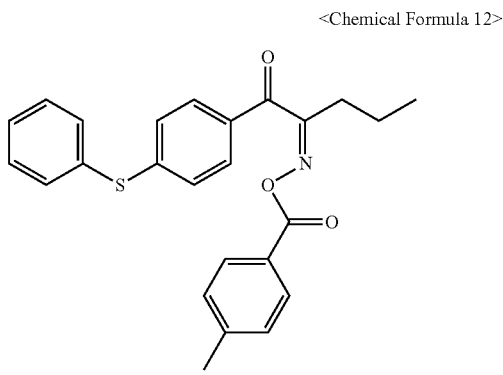

The photoresist composition may further include about 1 to 50 part by weight of a multifunctional acrylate oligomer with respect to about 100 parts of the acryl-copolymer, the multifunctional acrylate oligomer including at least one selected from the group of an aliphatic urethane acrylate oligomer, an aromatic urethane acrylate oligomer, an epoxy acrylate oligomer, an epoxy methacrylate oligomer, a silicon acrylate oligomer, a melamine acrylate oligomer, and a dendritic acrylate oligomer.

Embodiments are also directed to a method of forming a thin film transistor substrate including forming a thin film transistor on a base substrate, coating a photoresist composition on the thin film transistor to form a photoresist layer, exposing the photoresist layer to light, and developing the photoresist layer. The photoresist composition may include about 100 parts by weight of an acryl-copolymer, about 0.1 to about 30 parts by weight of a photo-initiator, about 1 to about 50 parts by weight of a first acrylate monomer including at least five functional groups; and about 1 to about 50 parts by weight of a second acrylate monomer including at most four functional groups, and including at least one selected from the group of compounds represented by the following Chemical Formulas 1 to 5, <Chemical Formula 1>

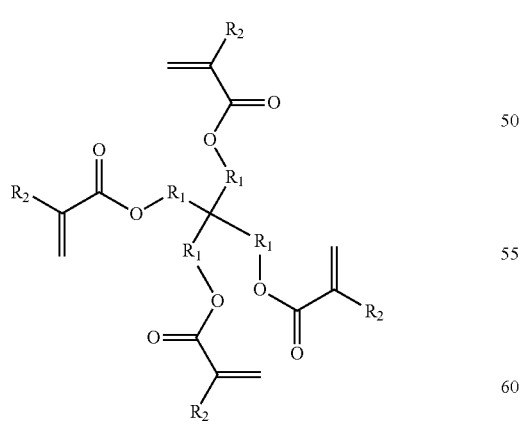

wherein in Chemical Formula 1, $R_1$ independently represents a C2-C10 alkylene group or a C2-C10 oxyalkylene group, which has carbon atoms of 2 to 10, and $R_2$ independently represents a hydrogen atom or a C1-C10 alkyl group, <Chemical Formula 2>

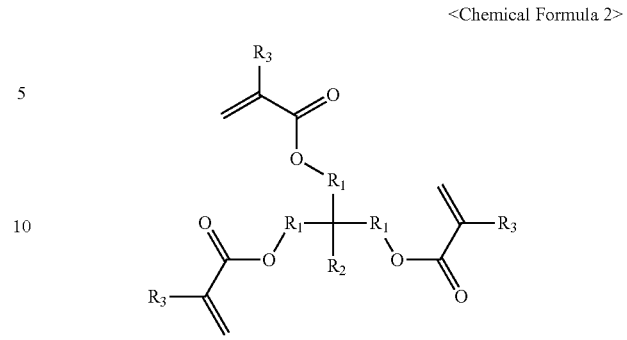

wherein, in Chemical Formula 2, $R_1$ independently represents a C1-C10 alkylene group or C1-C10 oxyalkylene or polyoxyalkylene group, $R_2$ represents a hydroxymethyl group, a C3-C10 alkyl group or C3-C10 alkoxy group, and $R_3$ independently represents a hydrogen atom or a C1-C10 alkyl group, <Chemical Formula 3>

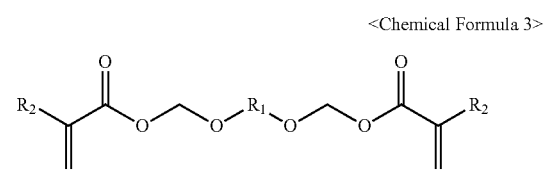

wherein, in Chemical Formula 3, $R_1$ represents a phenylene group, a tricyclodecylene group, an adamantylene group, a norboranylene group, a bisphenol-A group or a bisphenol-F group, and $R_2$ independently represents a hydrogen atom or an alkyl group having carbon atoms of 1 to 10, in Chemical Formula 3, <Chemical Formula 4>

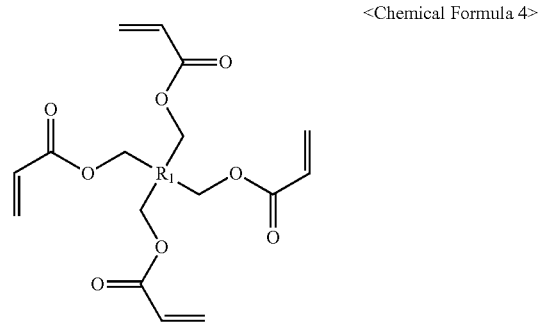

wherein, in Chemical Formula 4, $R_1$ represents a C2-C20 dialkyl ether group,

<Chemical Formula 5>

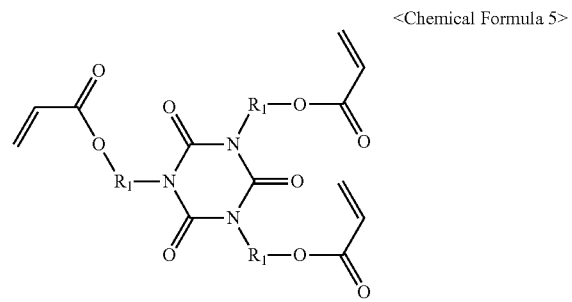

wherein, in Chemical Formula 5, $R_1$ independently represents a C1-C10 alkyl group or a C1-C10 alkoxy group.

The photoresist composition may further include a solvent such that a solid content of the photoresist composition is about 10 to 50% by weight.

The acryl-copolymer may be prepared by copolymerizing monomers including an unsaturated olefin compound and an unsaturated carboxylic acid through a radical polymerizing reaction.

A weight average molecular weight of the acryl-copolymer may be about 3,000 to about 30,000.

The first acrylate monomer may include at least one selected from the group of dipentaerythritol hexaacrylate, dipentaerythritol pentaacrylate, dipentaerythritol hydroxypentaacrylate, dipentaerythritol alkyloylpentaacrylate, and caprolactam-substituted dipentaerythritol hexaacrylate.

The second acrylate monomer may include at least one selected from the group of compounds represented by the following Chemical Formulas 6 to 11, <Chemical Formula 6>

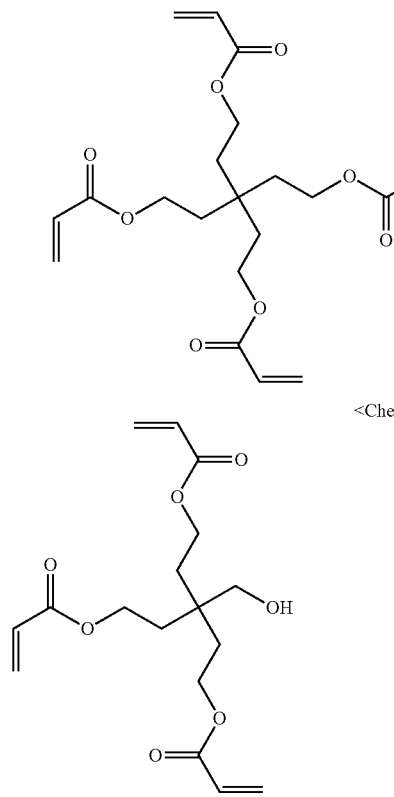

<Chemical Formula 7>

<Chemical Formula 8>

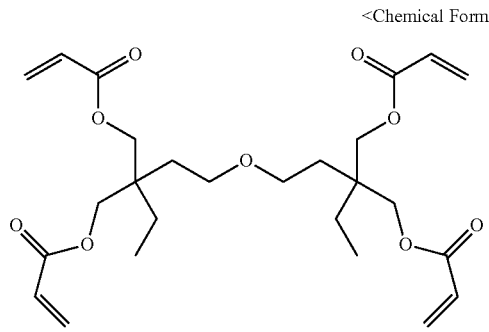

<Chemical Formula 9>

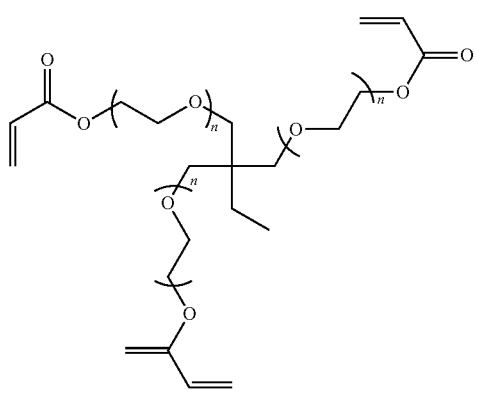

wherein, in Chemical Formula 9, n represents an integer of 1 to 3;

<Chemical Formula 10>

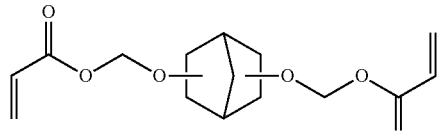

<Chemical Formula 11>

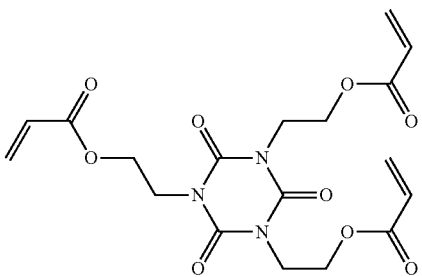

The photo-initiator may include an oxime-ester compound.

The photo-initiator may include a compound represented by the following Chemical Formula 12.

<Chemical Formula 12>

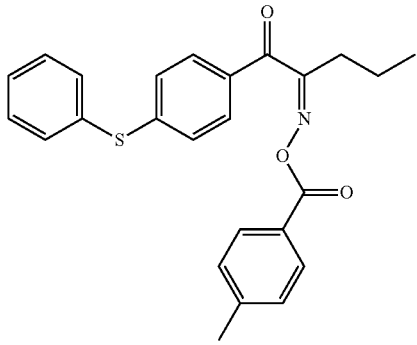

The photoresist composition may further include about 1 to 50 part by weight of a multifunctional acrylate oligomer with respect to about 100 parts of the acryl-copolymer, the multifunctional acrylate oligomer including at least one selected from the group of an aliphatic urethane acrylate oligomer, an aromatic urethane acrylate oligomer, an epoxy acrylate oligomer, an epoxy methacrylate oligomer, a silicon acrylate oligomer, a melamine acrylate oligomer, and a dendritic acrylate oligomer.

The base substrate may be pre-baked at about 80° C. to about 120° C., before the photoresist layer is exposed to light.

The base substrate may be hard-baked at about 150° C. to about 250° C., after the photoresist layer is developed.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
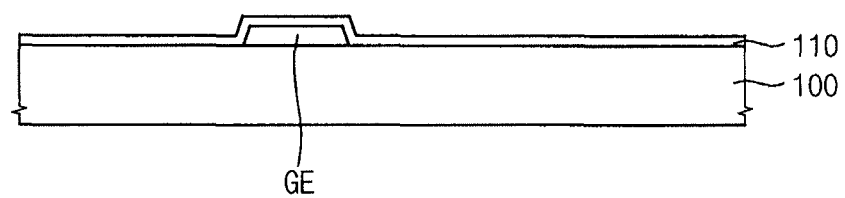
FIGS. 1 to 6 illustrate cross-sectional views depicting stages of a method of manufacturing a thin film transistor substrate according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Like reference numerals refer to like elements throughout.

Photoresist Composition

A photoresist composition according to an exemplary embodiment includes an acryl-copolymer, a photo-initiator, a first acrylate monomer including at least five functional groups and a second acrylate monomer having at most four functional groups.

For example, the photoresist composition may include about 0.1 to about 30 parts by weight of the photo-initiator, about 1 to 50 parts by weight of the first acrylate monomer, about 1 to 50 parts by weight of the second acrylate monomer with respect to about 100 parts by weight of the acryl-copolymer. The photoresist composition may further include a solvent such that a solid content of the photoresist composition is about 10 to 50% by weight.

The acryl-copolymer may be prepared by copolymerizing monomers including an unsaturated olefin compound and an unsaturated carboxylic acid in the presence of a solvent and a polymerization initiator through a radical polymerizing reaction.

Examples of the unsaturated carboxylic acid may include acrylic acid, methacrylic acid, maleic acid, fumaric acid, citraconic acid, mesaconic acid, itaconic acid, dicarboxyl anhydrates thereof, or the like. These may be used alone or in a combination thereof.

When the content of the unsaturated carboxylic acid is less than about 5% by weight based on a total weight of the monomers, the acryl copolymer may not be dissolved in an alkali solution. When the content of the unsaturated carboxylic acid is more than about 40% by weight based on a total weight of the monomers, a solubility of the acryl copolymer in an alkali solution may be excessively increased. Thus, the content of the unsaturated carboxylic acid in forming the acryl-copolymer may be, for example, about 5% to about 40% by weight based on a total weight of the monomers.

Examples of the unsaturated olefin compound may include methyl methacrylate, ethyl methacrylate, N-butyl methacrylate, sec-butyl methacrylate, tert-butyl methacrylate, methyl acrylate, isopropyl acrylate, cyclohexyl methacrylate, 2-methyl cyclohexyl methacrylate, dicyclopentenyl acrylate, dicyclopentanyl acrylate, dicyclopentenyl methacrylate, dicyclopentanyl methacrylate, dicyclopentanyloxyethyl methacrylate, isobornyl methacrylate, cyclohexyl acrylate, 2-methylcyclohexyl acrylate, dicyclopentanyloxyethyl acrylate, isobornyl acrylate, phenyl methacrylate, phenyl acrylate, benzyl acrylate, 2-hydroxyethyl methacrylate, styrene, alpha-methylstyrene, m-methylstyrene, p-methoxystyrene, vinyl toluene, p-methylstyrene, 1,3-butadiene, isoprene, 2,3-dimethyl-1,3-butadien, acrylic acid glycidyl, methacrylic acid glycidyl, α-ethyl acrylic acid glycidyl, α-n-propyl acrylic acid glycidyl, α-n-butyl acrylic acid glycidyl, acrylic acid-β-methyl glycidyl, methacrylic acid-β-methyl glycidyl, acrylic acid-β-ethyl glycidyl, methacrylic acid-β-ethyl glycidyl, acrylic acid-3,4-epoxybutyl, methacrylic acid-3,4-epoxybutyl, acrylic acid-6,7-epoxy heptyl, methacrylic acid-6,7-epoxy heptyl, α-ethyl acrylic acid-6,7-epoxy heptyl, o-vinylbenzyl glycidyl ether, m-vinyl benzylglycidyl ether, p-vinylbenzyl glycidyl ether, or methacrylic acid-3,4-epoxycyclohexyl. These may be used alone or in combination thereof.

Examples of the solvent for forming the acryl-copolymer may include methanol, tetrahydrofuran, toluene, dioxine, or the like.

The polymerization initiator may include a radical polymerization initiator. Examples of the polymerization initiator may include 2,2'-azobisisobutylnitrile, 2,2'-azobis(2,4-dimethylvaleronitrile), 2,2'-azobis(4-methoxy-2,4-dimethylvaleronitrile), 1,1'-azobis(cyclohexane-1-carbonitrile), dimethyl 2,2'-azobisisobutylate, or the like.

After a radical reaction is carried out in the presence of the solvent and the polymerization initiator, unreacted monomers may be removed through precipitation, filtering, and vacuum drying, thereby obtaining the acryl-copolymer. A polystyrene-converted weight-average molecular weight of the acryl-copolymer may be about 3,000 to about 30,000. When the weight-average molecular weight of the acryl-copolymer is less than 3,000, a developing ability, a residual ratio, and a heat-resistance or the like may be reduced. When the weight-average molecular weight of the acryl-copolymer is more than 30,000, it may be difficult to form a fine pattern.

The first acrylate monomer includes at least five functional groups. Examples of the first acrylate monomer may include dipentaerythritol hexaacrylate, dipentaerythritol pentaacrylate, dipentaerythritol hydroxypentaacrylate, dipentaerythritol alkyloylpentaacrylate, caprolactam-substituted dipentaerythritol hexaacrylate, or the like. These may be used alone or in a combination thereof.

When the content of the first acrylate monomer is less than 1 part by weight with respect to about 100 parts of the acryl-copolymer, a sensitivity may be reduced, thereby reducing a residual ratio. When the content of the first acrylate monomer is more than 50 parts by weight to about 100 parts of the acryl-copolymer, a developing ability and a resolution may be reduced. Thus, the content of the first acrylate monomer may be about 1 to 50 parts by weight with respect to about 100 parts of the acryl-copolymer, or, for example, about 10 to about 30 parts by weight.

The second acrylate monomer includes at most four functional groups. The second acrylate monomer may reduce fumes in the process of forming a photoresist pattern.

The second acrylate monomer may include at least one of compounds represented by the following Chemical Formulas 1 to 5.

<Chemical Formula 1>

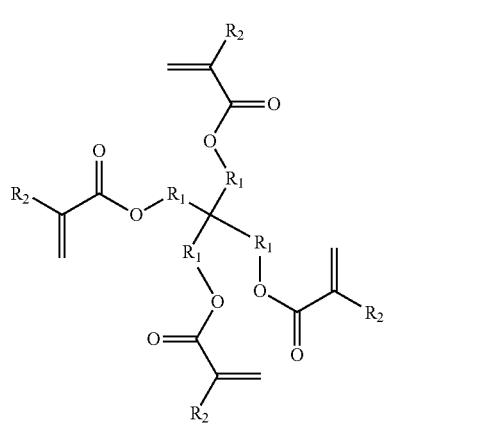

In Chemical Formula 1, $R_1$ independently represents an alkyl group (alkylene group) or an alkoxy group (oxyalkylene group), that has 2 to 10 carbon atoms. $R_2$ independently represents a hydrogen atom or an alkyl group having 1 to 10 carbon atoms.

<Chemical Formula 2>

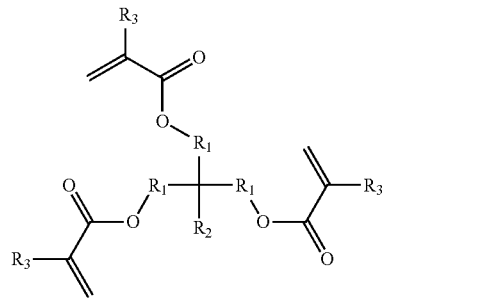

In Chemical Formula 2, $R_1$ independently represents an alkylene group, an oxyalkylene group or a polyoxyalkylene group that has 1 to 10 carbon atoms. $R_2$ represents a hydroxymethyl group, an alkyl group, or an alkoxy group that has 3 to 10 carbon atoms. $R_3$ independently represents a hydrogen atom or an alkyl group having 1 to 10 carbon atoms.

<Chemical Formula 3>

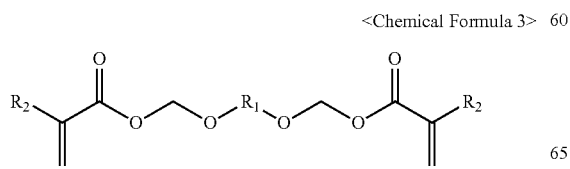

In Chemical Formula 3, $R_1$ represents a benzyl group (for example, a phenylene group), a tricyclodecane group (for example, a tricyclodecylene group), a norbornanyl group (for example, a norbornanylene group), an adamantyl group (for example, an adamantylene group), a bisphenol-A group or a bisphenol-F group. $R_2$ independently represents a hydrogen atom or an alkyl group having 1 to 10 carbon atoms.

<Chemical Formula 4>

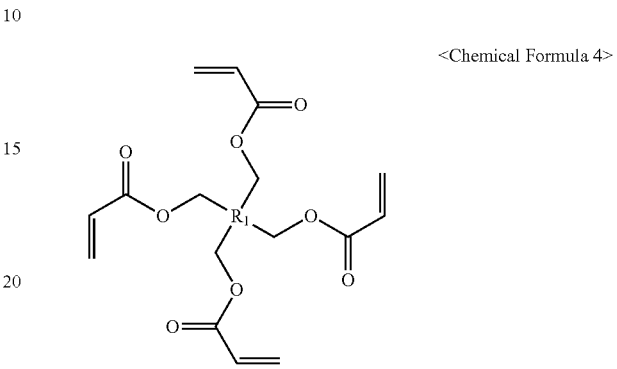

In Chemical Formula 4, $R_1$ represents a dialkyl ether group having 2 to 20 carbon atoms.

<Chemical Formula 5>

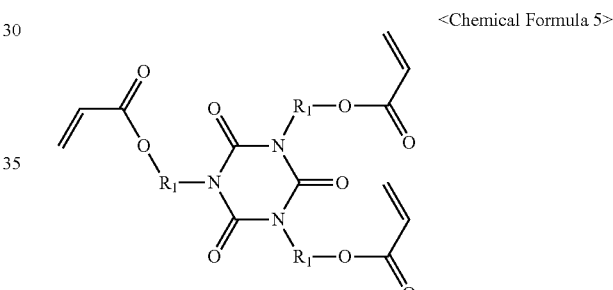

In Chemical Formula 5, $R_1$ independently represents an alkylene group or an oxyalkylene group that has 1 to 10 carbon atoms.

For example, the second acrylate monomer may include at least one of compounds represented by the following Chemical Formulas 6 to 11.

<Chemical Formula 6>

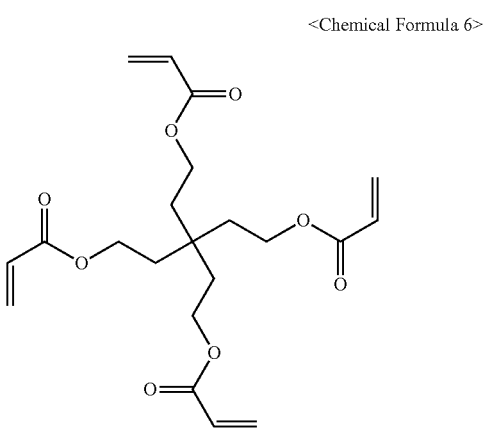

-continued

<Chemical Formula 7>

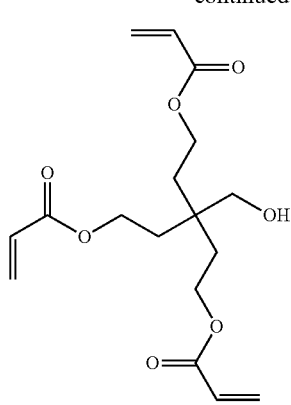

<Chemical Formula 8>

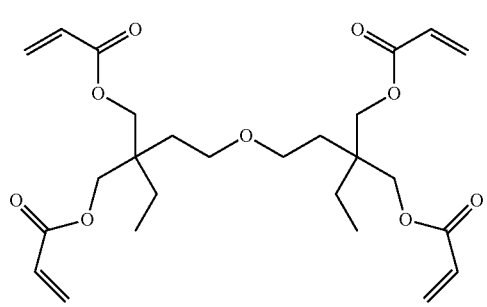

<Chemical Formula 9>

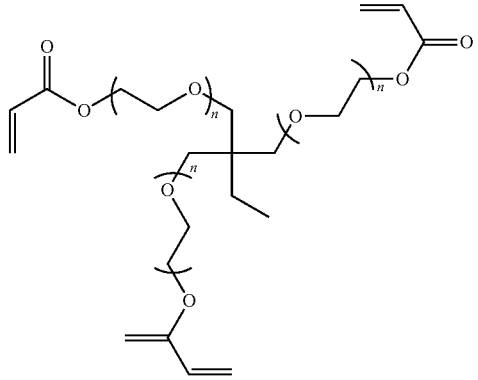

<Chemical Formula 10>

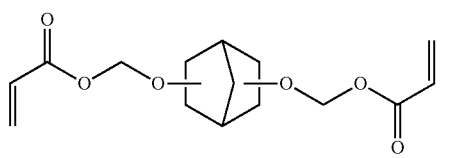

<Chemical Formula 11>

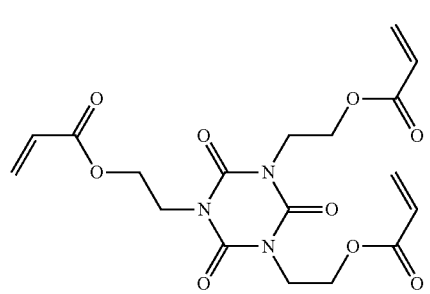

In Chemical Formula 9, n represents an integer of 1 to 3.

When the content of the second acrylate monomer is less than 1 part by weight with respect to about 100 parts of the acryl-copolymer, a sensitivity may be reduced thereby reducing a residual ratio. When the content of the second acrylate monomer is more than 50 parts by weight to about 100 parts of the acryl-copolymer, a developing ability and a resolution may be reduced. The content of the second acrylate monomer may be about 1 to 50 parts by weight with respect to about 100 parts of the acryl-copolymer, or, for example, about 5 to about 20 parts by weight.

Examples of the photo-initiator may include an oxime compound such as, for example, an oxime-ester compound. For example, the photo-initiator may include a compound represented by the following Chemical Formula 12.

<Chemical Formula 12>

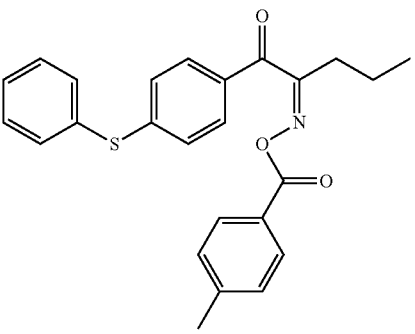

Examples of the solvent may include alcohols such as, for example, methanol and ethanol, ethers such as tetrahydrofurane, glycol ethers such as ethylene glycol monomethyl ether and ethylene glycol monoethyl ether, ethylene glycol alkyl ether acetates such as methyl cellosolve acetate and ethyl cellosolve acetate, diethylene glycols such as diethylene glycol monomethyl ether, diethylene glycol monoethyl ether and diethylene glycol dimethyl ether, propylene glycol monoalkyl ethers such as propylene glycol methyl ether, propylene glycol ethyl ether, propylene glycol propyl ether and propylene glycol butyl ether, propylene glycol alkyl ether acetates such as propylene glycol methyl ether acetate, propylene glycol ethyl ether acetate, propylene glycol propyl ether acetate and propylene glycol butyl ether acetate, propylene glycol alkyl ether propionates such as propylene glycol methyl ether propionate, propylene glycol ethyl ether propionate, propylene glycol propyl ether propionate and propylene glycol butyl ether propionate, aromatic compounds such as toluene and xylene, ketones such as methyl ethyl ketone, cyclohexanone and 4-hydroxy-4-methyl-2-pentanone, and ester compounds such as methyl acetate, ethyl acetate, propyl acetate, butyl acetate, ethyl 2-hydroxypropionate, methyl 2-hydroxy-2-methyl propionate, ethyl 2-hydroxy-2-methyl propionate, methyl hydroxyacetate, ethyl hydroxyacetate, butyl hydroxyacetate, methyl lactate, ethyl lactate, propyl lactate sulfate, butyl lactate, methyl 3-hydroxypropionate, ethyl 3-hydroxypropionate, propyl 3-hydroxypropionate, butyl 3-hydroxypropionate, methyl 2-hydroxy-3-methyl butanoate, methyl methoxy acetate, ethyl methoxy acetate, propyl methoxy acetate, butyl methoxy acetate, methyl ethoxy acetate, ethyl ethoxy acetate, propyl ethoxy acetate, butyl ethoxy acetate, methyl propoxy acetate, ethyl propoxy acetate, propyl propoxy acetate, butyl propoxy acetate, methyl butoxy acetate, ethyl butoxy acetate, propyl butoxy acetate, butyl butoxy acetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate, butyl 3-butoxypropionate, or the like. These may be used alone or in a combination thereof. Among the above examples, glycol ethers, ethylene glycol alkyl ether acetates and diethylene glycols may be used in view of the solubility and reactivity of each of the components composing the photoresist composition.

For example, the solvent may be added such that the solid content of the photoresist composition is about 10 to 50% by weight based on a total weight of the photoresist composition, or, for example, about 15 to 40% by weight.

The photoresist composition may further include a multifunctional acrylate oligomer. For example, the content of the multifunctional acrylate oligomer may be 1 to 50 parts by weight with respect to about 100 parts of the acryl-copolymer. The multifunctional acrylate oligomer may have 2 to 20 of functional groups.

Examples of the multifunctional acrylate oligomer may include an aliphatic urethane acrylate oligomer, an aromatic urethane acrylate oligomer, an epoxy acrylate oligomer, an epoxy methacrylate oligomer, a silicon acrylate oligomer, a melamine acrylate oligomer, a dendritic acrylate oligomer, or the like. These may be used alone or in a combination thereof.

The photoresist composition may further include an adhesion enhancer such as a melamine cross-linker, a silane coupling agent, or the like. The content of the adhesion enhancer may be 1 to 10 parts by weight with respect to about 100 parts of the acryl-copolymer.

Examples of the silane coupling agent may include KBM-303, KBM-403, KBE-402, KBE-40 (trade names, Shietsu, Japan), or the like. Examples of the melamine cross-linker may include MW-30M, MX-706 (trade names, VISION-TECH, Korea), or the like. These may be used alone or in a combination thereof.

The photoresist composition according to an exemplary embodiment may be coated, pre-baked, exposed to a light, developed, and hard-baked to form a photoresist pattern. Fumes or outgas caused in a heating process such as a pre-baking process or a hard-baking process may be reduced. Thus, failures due to impurities generated by fumes or an outgas may be reduced and/or prevented.

When the photoresist composition is used for forming an organic insulation layer of a display panel, a residue in a contact hole may be reduced, and a greenish effect caused by a UV or a near UV in the process of curing a sealant may be reduced.

The photoresist composition may improve an adhesive strength of a photoresist pattern, and may form a photoresist layer having a high transmittance.

Hereinafter, a method of manufacturing a thin film transistor substrate according to an exemplary embodiment will be more fully explained with reference to the accompanying drawings.

FIGS. 1 to 6 illustrate cross-sectional views depicting stages a method of manufacturing a display substrate according to an exemplary embodiment.

Referring to FIG. 1, a gate metal pattern including a gate electrode GE may be formed on a base substrate 100. The gate metal pattern may further include a gate line connected to the gate electrode GE.

For example, a gate metal layer may be formed on the base substrate 100, and patterned to form the gate line and the gate electrode GE. Examples of the base substrate 200 may include a glass substrate, a quartz substrate, a silicon substrate, a plastic substrate, or the like.

Examples of a material that may be used for the gate metal layer may include copper, silver, chromium, molybdenum, aluminum, titanium, manganese, or an alloy thereof. The gate metal layer may have a single-layered structure or may have a multiple-layered structure including different materials. For example, the gate metal layer may include a copper layer and a titanium layer disposed on and/or under the copper layer.

A gate insulation layer 110 may be formed to cover the gate line and the gate electrode GE. The gate insulation layer 110 may include silicon nitride, silicon oxide or the like. The gate insulation layer 110 may have a single-layered structure or a multiple-layered structure. For example, the gate insulation layer 110 may include a lower insulation layer including silicon nitride and an upper insulation layer including silicon oxide.

Figure 2:
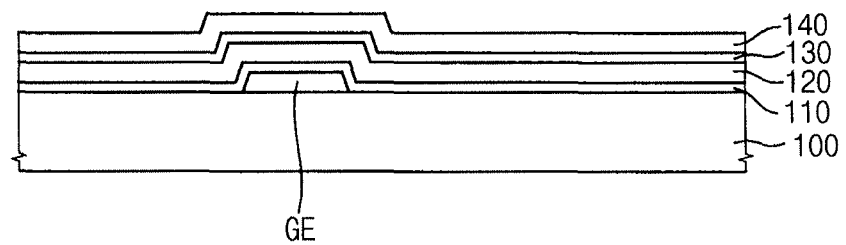

Referring to FIG. 2, a semiconductor layer 120, an ohmic contact layer 130 and a source metal layer 140 may be sequentially formed on the gate insulation layer 110.

The semiconductor layer 120 may include amorphous silicon. The ohmic contact layer 130 may include amorphous silicon into which n+ impurities are implanted at a high concentration. In another implementation, the semiconductor layer 120 may include an oxide semiconductor. When the semiconductor layer 120 includes an oxide semiconductor, the ohmic contact layer 130 may be omitted.

Examples of a material that may be used for the source metal layer 140 may include copper, silver, chromium, molybdenum, aluminum, titanium, manganese, or an alloy thereof. The source metal layer may have a single-layered structure or may have a multiple-layered structure including different materials. For example, the source metal layer may have a triple-layered structure of molybdenum/aluminum/molybdenum. In another implementation, the source metal layer 140 may have a multiple-layered structure including a metal layer and a barrier layer including a transparent conductive oxide.

Figure 3:
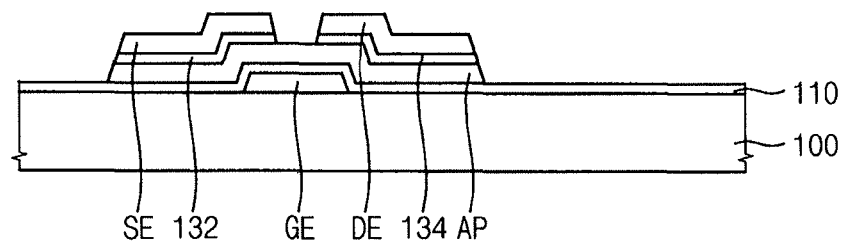

Referring to FIG. 3, a photoresist pattern may be formed on the source metal layer 140. The source metal layer 140, the ohmic contact layer 130 and the semiconductor layer 120 may be patterned to form an active pattern AP, an ohmic contact pattern, a source electrode SE and a drain electrode DE.

The active pattern AP may overlap with the gate electrode GE. The ohmic contact pattern may be disposed on the active pattern AP and may include a first ohmic contact pattern 132 contacting the source electrode SE and a second ohmic contact pattern 134 contacting the drain electrode DE.

The gate electrode GE, the active pattern AP, the source electrode SE, and the drain electrode DE may constitute a thin film transistor.

The source metal layer 140, the ohmic contact layer 130, and the semiconductor layer 120 may be patterned by using a same mask and a same photolithography process using a photoresist pattern formed through a half-tone exposure to have thickness gradient.

Figure 4:
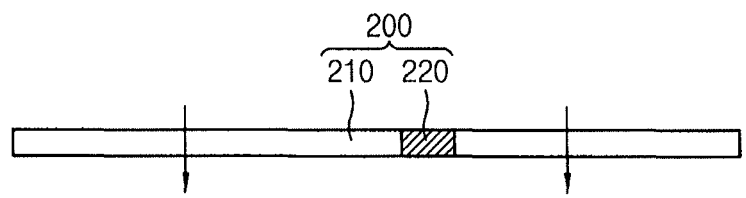
Figure 4:
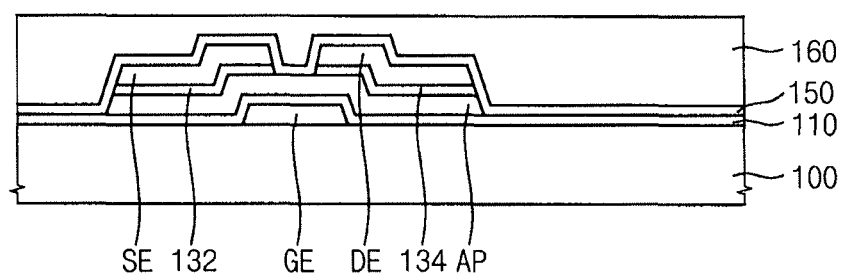

Referring to FIG. 4, a passivation layer 150 may be formed on the thin film transistor. The passivation layer 150 may include an inorganic insulation material such as silicon oxide, silicon nitride or the like. A photoresist composition may be coated on the passivation layer 150 to form a photoresist film 160. The photoresist composition may include an acryl-copolymer, a photo-initiator, a first acrylate monomer including at least five functional groups, and a second acrylate monomer having at most 4 functional groups. For example, the photoresist composition may include about 0.1 to about 30 parts by weight of the photo-initiator, about 1 to 50 parts by weight of the first acrylate monomer, about 1 to 50 parts by weight of the second acrylate monomer with respect to about 100 parts by weight of the acryl-copolymer. The photoresist composition may further include a solvent such that a solid content of the photoresist composition is about 10 to 50% by weight.

The photoresist composition may be substantially the same as the previously explained photoresist composition according to an exemplary embodiment. Thus, any duplicative explanation will not be repeated.

The photoresist composition may be coated on the base substrate 100, for example, through spin-coating or the like.

The photoresist film 160 may be pre-baked to remove the solvent. For example, the photoresist film 160 may be heated at about 80° C. to about 120° C.

Thereafter, the photoresist film 160 may be exposed to light through a mask 200. Light such as UV, an electron beam, an X ray, or the like may be used.

The mask 200 may be disposed on the photoresist film 160. The mask 200 may include a light-transmitting portion 210 and a light-blocking portion 220. A portion of the photoresist film 160 overlapping with the light-transmitting portion 210 may be exposed to light and hardened. A portion of the photoresist film 160 overlapping with the light-blocking portion 220 may not be exposed to the light. The light-blocking portion 220 may overlap with the drain electrode DE.

Figure 5:
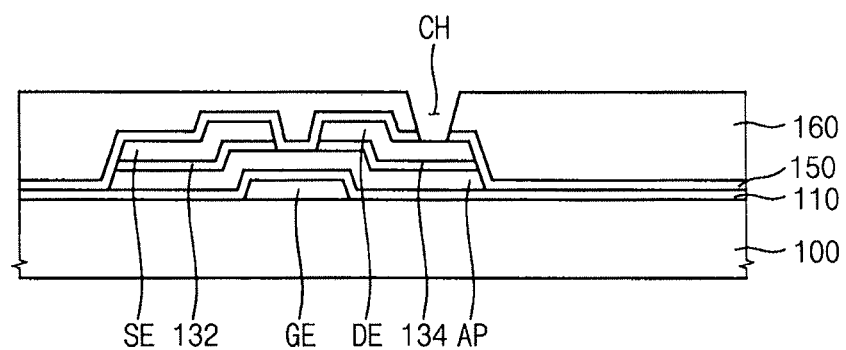

Referring FIG. 5, a developing solution is provided to the photoresist film 160. The developing solution may be an alkali solution. The portion of the photoresist film 160 overlapping with the light-transmitting portion 210 may remain to form an organic insulation layer, and the portion of the photoresist film 160 overlapping with the light-blocking portion 220 may be removed to form a contact hole CH passing through the organic insulation layer. Thus, a passivation layer 150 may be partially exposed through the contact hole CH.

The developing solution may include an inorganic alkali such as sodium hydroxide, potassium hydroxide or sodium carbonate, a first degree amine such as n-propyl amine, a second degree amine such as diethyl amine, a third degree amine such as trimethyl amine, methyldiethyl amine, dimethylethyl amine or triethyl amine, an alcohol amine such as dimethylethanol amine, methyldiethanol amine or triethanol amine, or a fourth degree ammonium salt such as tetramethylammonium hydroxide or tetraethylammonium hydroxide, as examples.

After the photoresist film 160 is developed, a hard-baking process may be performed in a heating apparatus such as an oven in order to improve an adhesive strength of the photoresist film 160. For example, the photoresist film 160 may be heated at about 150° C. to about 250° C. Before the hard-baking process is performed, the photoresist film 160 may be further exposed to light such that the photoresist film 160 may be further cured. Hereinafter, the photoresist film 160 that is treated as described above will be referred to as the "organic insulation layer 160'."

An exposed portion of the passivation layer 150 may be removed to expose a portion of the drain electrode DE.

Figure 6:
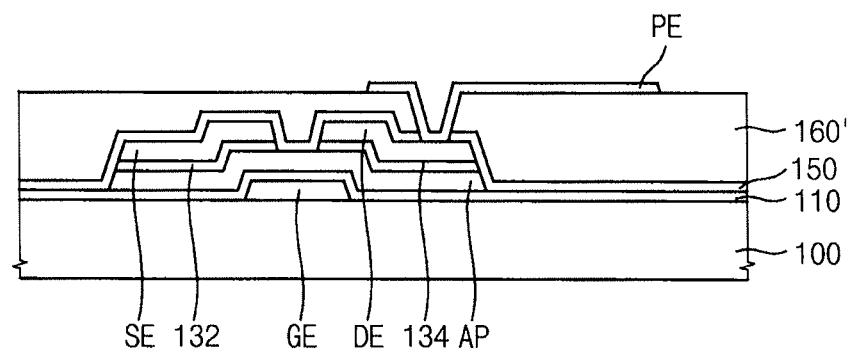

Referring to FIG. 6, a conductive layer may be formed on the organic insulation layer 160' and patterned to form a pixel electrode PE. The pixel electrode PE may include a conductive metal oxide, indium tin oxide, indium zinc oxide, or the like.

The pixel electrode PE may be electrically connected to the drain electrode DE through the contact hole CH passing through the organic insulation layer 160' and the passivation layer 150.

The thin film transistor substrate may be coupled to an opposing substrate by a sealant. The thin film transistor substrate may be used for a display substrate of a liquid crystal display panel or an organic electroluminescence display panel.

In an embodiment, the photoresist composition may be used for forming a flattening layer of a thin film transistor substrate. In another embodiment, the photoresist composition may be used for forming various insulation layers of a thin film transistor substrate, a flattening layer of an opposing substrate, a column spacer, an overcoating layer, a color resist, a partition layer or the like. In addition, the photoresist composition may be used for manufacturing a liquid crystal display device, an organic electroluminescence display device, an electrowetting display device, an electrophoresis display device, or the like.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthetic Example

About 400 parts by weight of tetrahydrofuran, about 30 parts by weight of methacrylic acid, about 30 parts by weight of styrene and about 40 parts by weight of glycidyl methacrylate were put into a flask having a cooler and a stirrer, and mixed at about 600 rpm. Thereafter, about 15 parts by weight of 2,2'-azobis(2,4-dimethylvaleronitrile) was added thereto. The mixture was gradually heated to about 55° C. and maintained for about 24 hours. Thereafter, the mixture was rapidly cooled to a room temperature. About 500 ppm of hydroxybenzophenone as a polymerization inhibitor was added to the mixture to obtain a copolymer composition having a solid content of about 30% by weight.

In order to remove unreacted monomers, about 1,000 parts by weight of n-hexane was added with respect to about 100 parts by weight of the copolymer composition for precipitation. A poor solvent including unreacted monomers was removed from the copolymer composition through a filtering process using a sifter. Thereafter, the copolymer composition was vacuum-dried at about 55° C. or less to completely remove remaining solvent and unreacted monomers so that an acryl copolymer was obtained.

A polystyrene-converted weight-average molecular weight of the acryl copolymer was about 6,000, as measured by GPC Example 1

About 100 parts by weight of the acryl copolymer of the Synthetic Example, about 20 parts by weight of a photo-initiator represented by the following Chemical Formula 13, about 20 parts by weight of dipentaerythritol pentaacrylate as a first acrylate monomer including at least 5 functional groups, about 10 parts by weight of a second acrylate monomer represented by the following Chemical Formula 14 were mixed. Propylene glycol monoethyl acetate was added to the mixture such that the solid content was about 20% by weight, and the mixture was filtered by a Millipore filter of 0.2 μm to prepare a negative photoresist composition.

<Chemical Formula 13>

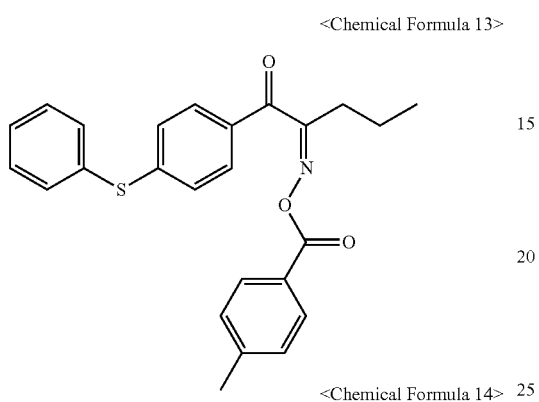

<Chemical Formula 14>

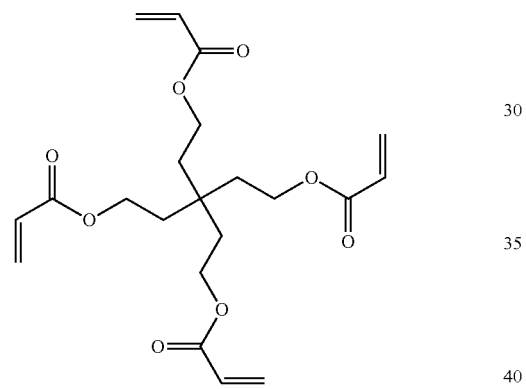

Example 2

A negative photoresist composition was prepared through a same method as Example 1 except for using a compound represented by the following Chemical Formula 15 as the second acrylate monomer.

<Chemical Formula 15>

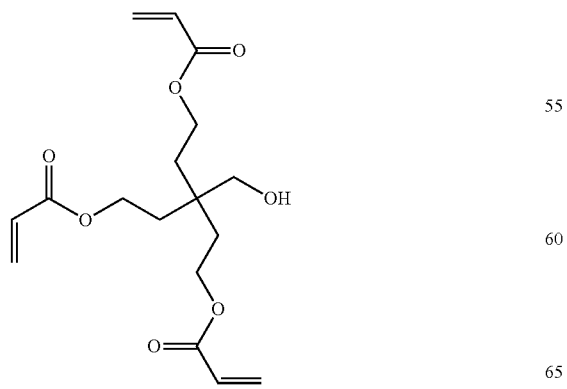

Example 3

A negative photoresist composition was prepared through a same method as Example 1 except for using a compound represented by the following Chemical Formula 16 as the second acrylate monomer.

<Chemical Formula 16>

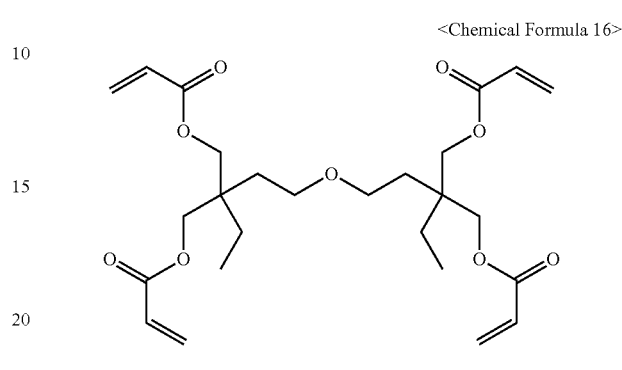

Example 4

A negative photoresist composition was prepared through a same method as Example 1 except for using a compound represented by the following Chemical Formula 17 (n=2) as the second acrylate monomer.

<Chemical Formula 17>

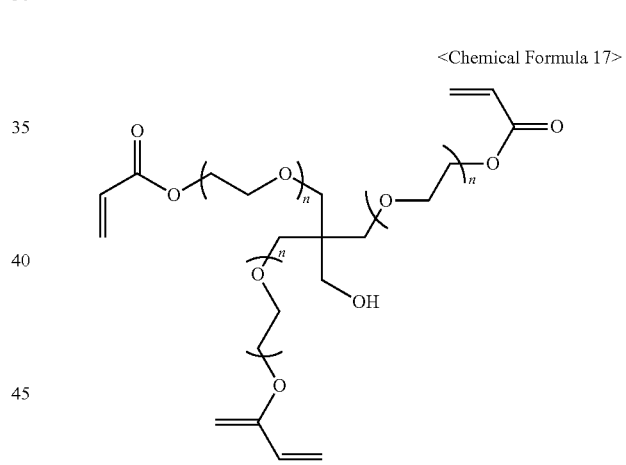

Example 5

A negative photoresist composition was prepared through a same method as Example 1 except for using a compound represented by the following Chemical Formula 18 as the second acrylate monomer.

<Chemical Formula 18>

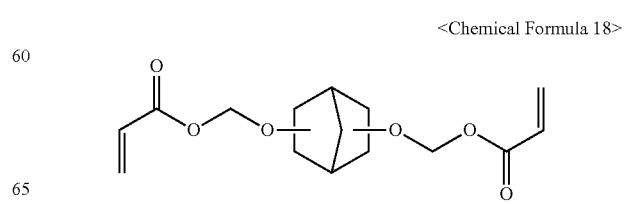

Comparative Example 1

A negative photoresist composition was prepared through a same method as Example 1 except for using a compound represented by the following Chemical Formula 19 as the second acrylate monomer.

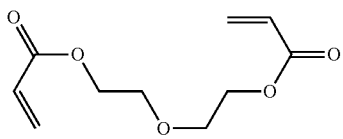

<Chemical Formula 19>

Comparative Example 2

A negative photoresist composition was prepared through a same method as Example 1 except for using a compound represented by the following Chemical Formula 20 as the second acrylate monomer.

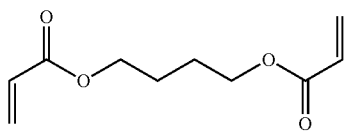

<Chemical Formula 20>

Comparative Example 3

A negative photoresist composition was prepared through a same method as Example 1 except for using a compound represented by the following Chemical Formula 21 as the second acrylate monomer.

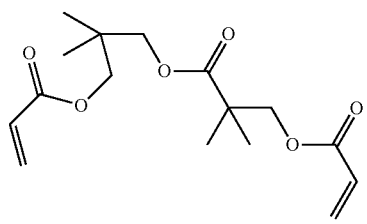

<Chemical Formula 21>

Comparative Example 4

A negative photoresist composition was prepared through a same method as Example 1 except for using a compound represented by the following Chemical Formula 22 as the second acrylate monomer.

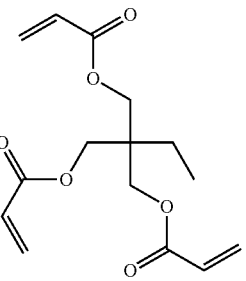

<Chemical Formula 22>

Experimental Results

Characteristics of negative photoresist compositions of Examples 1 to 5 and Comparative Examples 1 to 4 were evaluated as follows, and the obtained results are represented by the following Table 1.

A) Sensitivity: A negative photoresist composition was coated by a spin coater onto a glass substrate having a silicon nitride layer, and pre-baked on a hot plate at about 100° C. for about 2 minutes to form a photoresist film having a thickness of about 3.4 μm.

An UV light having an intensity of about 10 mW/cm$^2$ at about 365 nm was irradiated to the photoresist film for about 1 to 5 seconds with a gap of about 0.2 seconds through a pattern mask having a predetermined pattern from a broadband exposure. Thereafter, the photoresist film was developed by an aqueous solution including about 2.50% by weight of tetramethylammonium hydroxide for about 50 seconds at about 23° C. The photoresist film was cleaned with pure water for about 60 seconds to form a photoresist pattern.

The photoresist pattern was heated in an oven at about 220° C. for about 60 minutes for curing. Sensitivity was measured when a residual ration was saturated with respect to a 20 μm line and a space critical dimension (CD).

B) Maximum resolution: A minimum size of a contact hole, at which a same CD bias could be maintained, was measured for the photoresist pattern formed for evaluating the sensitivity.

C) Scum in contact hole: Scum in the contact hole of the photoresist pattern formed for evaluating the sensitivity was measured. "○" represents no scum, and "X" represents observed scum.

D) Adhesive strength: A minimum residue of the photoresist pattern formed for evaluating the sensitivity was measured. "○" represents a thickness less than about 1.0 μm, "Δ" represents a thickness of about 1.0 μm to about 1.5 μm and "X" represents a thickness more than about 1.5 μm.

E) Transmittance: A photoresist pattern was formed on a glass substrate through a same method as the above. A transmittance of the photoresist pattern was measured by a spectrophotometer. "○" represents a transmittance more than about 93%, "Δ" represents a transmittance of about 90% to about 93%, and "X" represents a transmittance less than about 90%.

F) Greenish effect: The photoresist pattern formed for evaluating the transmittance was further exposed to light from an iron halide metal lamp generating light of about 200 nm to about 450 nm with an intensity of about 10 J/cm$^2$ with respect to light of about 365 nm. Thereafter, a color coordinate of the photoresist pattern was measured before and after being exposed to the light. "○" represents a color coordinate difference less than about 10%, "Δ" represents a color coordinate difference of about 10% to about 30%, and "X" represents a color coordinate difference more than about 30%.

G) Contrast ratio: The substrate used for evaluating the transmittance was interposed between polarizing plates of normally white mode, and a contrast ratio, which is a brightness at a white mode to a brightness at a black mode, was measured by a contrast tester (model name: CT-1). "○" represents a contrast ratio more than about 22,000, "Δ" represents a contrast ratio of about 20,000 to about 22,000, and "X" represents a contrast ratio less than about 20,000.

H) Fume amount: The negative photoresist compositions of Examples 1 to 5 and Comparative Examples 1 to 4 were respectively coated on a glass substrate. Fumes generated from the photoresist compositions pre-baked in a purge & trap apparatus for 5 minutes at about 100° C. were collected by a collecting pipe. The collected fumes were separated for a quantitative analysis and a qualitative analysis. "○" represents a fume amount ratio less than about 50% by weight with respect to the fume amount of Comparative Example 1, and "X" represents a fume amount ratio no less than about 50% by weight with respect to fume amount of Comparative Example 1.

or causing defects. Furthermore, a residue may remain in a contact hole formed in the organic insulation layer, and the organic insulation layer may be discolored by a UV or a near UV in the process of curing a sealant for combining substrates.

Exemplary embodiments provide a photoresist composition capable of reducing fumes in a high-temperature process.

According to embodiments, fumes or outgas caused in a heating process such as a pre-baking process or a hard-baking process may be reduced. Thus, failures due to impurities generated by fumes or outgas may be reduced and/or prevented.

According to embodiments, when the photoresist composition is used for forming an organic insulation layer of a display panel, a residue in a contact hole may be reduced, and a greenish effect caused by a UV or a near UV in the process of curing a sealant may be reduced.

According to embodiments, the photoresist composition may improve an adhesive strength of a photoresist pattern, and may form a photoresist layer having a high transmittance.

TABLE 1

| | Sensitivity (mJ/cm$^2$) | Maximum resolution (μm) | Scum in contact hole | Adhesive Strength | Transmittance | Greenish effect | Contrast ratio | Fumes |
|---|---|---|---|---|---|---|---|---|
| Example 1 | 40 | 6 | ○ | ○ | ○ | ○ | ○ | ○ |
| Example 2 | 40 | 6 | ○ | ○ | ○ | ○ | ○ | ○ |
| Example 3 | 40 | 6 | ○ | ○ | ○ | ○ | ○ | ○ |
| Example 4 | 40 | 6 | ○ | ○ | ○ | ○ | ○ | ○ |
| Example 5 | 41 | 6 | ○ | ○ | ○ | ○ | ○ | ○ |
| Comparative Example 1 | 40 | 7 | ○ | X | ○ | ○ | ○ | X |
| Comparative Example 2 | 41 | 7 | ○ | X | ○ | ○ | ○ | X |
| Comparative Example 3 | 41 | 7 | ○ | X | ○ | ○ | ○ | X |
| Comparative Example 4 | 43 | 7 | ○ | X | ○ | ○ | ○ | X |

Referring to Table 1, the photoresist compositions of Examples 1 to 5 may reduce fumes generated in the process of forming a photoresist pattern, and may improve an adhesive strength of the photoresist pattern. Furthermore, the photoresist compositions may have desirable characteristics with regard a maximum resolution, a transmittance, a greenish effect, and a contrast ratio. Furthermore, the photoresist composition may reduce or prevent scum in a contact hole of a photoresist pattern.

Thus, it can be noted that photoresist compositions according to examples may increase a reliability of a photolithography process and may be appropriately used for manufacturing a display device having a high resolution and a narrow bezel.

By way of summation and review, In order to form an organic insulation layer, such as an organic insulation layer covering a thin film transistor, a photoresist composition may be used. For example, the photoresist composition may be coated, pre-baked, exposed to light, developed, and hard-baked to form the organic insulation layer having the contact hole.

With a general photoresist composition, fumes may be generated in a heating process such as a pre-baking process, a hard-baking process, or the like. The fumes may form impurities on a substrate thereby contaminating a chamber Exemplary embodiments further provide a method of manufacturing a thin film transistor substrate using the photoresist composition.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope thereof as set forth in the following claims.

What is claimed is:

1. A photoresist composition, comprising:

about 100 parts by weight of an acryl-copolymer;

about 0.1 to about 30 parts by weight of a photo-initiator;

about 1 to about 50 parts by weight of a first acrylate monomer including at least five functional groups; and about 1 to about 50 parts by weight of a second acrylate monomer including at most four functional groups, the second acrylate monomer being at least one selected from the group of compounds represented by the following Chemical Formulas 1 to 4, <Chemical Formula 1>

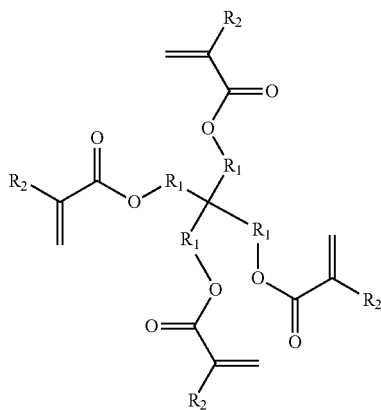

wherein, in Chemical Formula 1, $R_1$ independently represents a C2-C10 alkylene group, and $R_2$ independently represents a hydrogen atom or a C1-C10 alkyl group, <Chemical Formula 2>

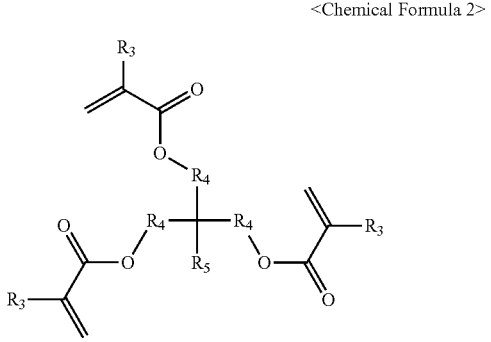

wherein, in Chemical Formula 2, $R_3$ independently represents a hydrogen atom or a C1-C10 alkyl group, $R_4$ independently represents a C2-C10 alkylene group, and $R_5$ represents a hydroxymethyl group, a C3-C10 alkyl group or C3-C10 alkoxy group, and $R_3$ independently represents a hydrogen atom or a C1-C10 alkyl group, <Chemical Formula 3>

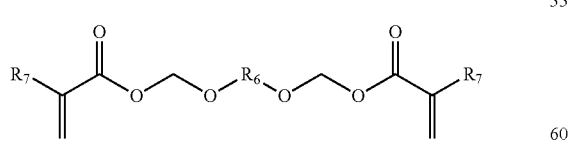

wherein, in Chemical Formula 3, $R_6$ represents a phenylene group, a tricyclodecylene group, an adamantylene group, a norboranylene group, a bisphenol-A group or a bisphenol-F group, and $R_7$ independently represents a hydrogen atom or a C1 to C10 alkyl group, <Chemical Formula 4>

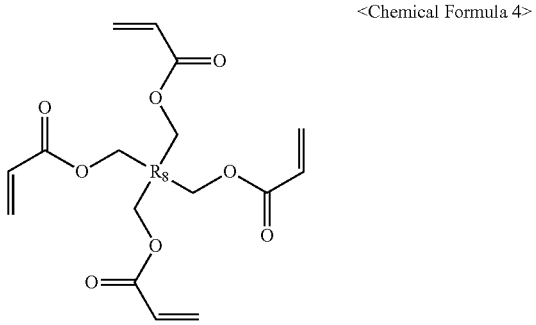

wherein, in Chemical Formula 4, $R_8$ represents a C2-C20 dialkyl ether group.

2. The photoresist composition as claimed in claim 1, further comprising a solvent such that a solid content of the photoresist composition is about 10 to about 50% by weight.

3. The photoresist composition as claimed in claim 1, wherein the acryl-copolymer is prepared by copolymerizing monomers including an unsaturated olefin compound and an unsaturated carboxylic acid through a radical polymerizing reaction.

4. The photoresist composition as claimed in claim 3, wherein a weight average molecular weight of the acryl-copolymer is about 3,000 to about 30,000.

5. The photoresist composition as claimed in claim 1, wherein the first acrylate monomer includes at least one selected from the group of dipentaerythritol hexaacrylate, dipentaerythritol pentaacrylate, dipentaerythritol hydroxypentaacrylate, dipentaerythritol alkyloylpentaacrylate, and caprolactam-substituted dipentaerythritol hexaacrylate.

6. The photoresist composition as claimed in claim 1, wherein the second acrylate monomer includes at least one selected from the group of compounds represented by the following Chemical Formulas 6 to 8 and 10, <Chemical Formula 6>

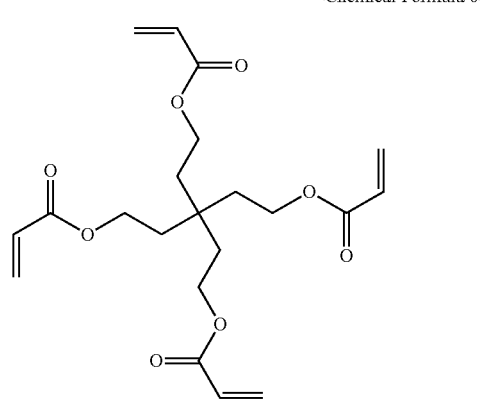

-continued

<Chemical Formula 7>

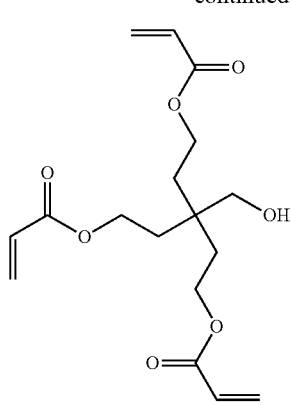

<Chemical Formula 8>

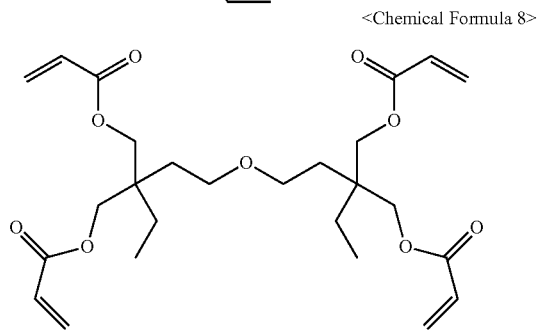

<Chemical Formula 10>

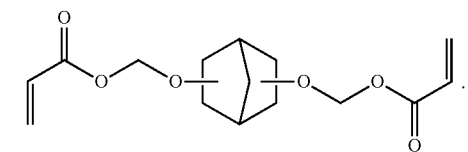

7. The photoresist composition as claimed in claim 1, wherein the photo-initiator includes an oxime-ester compound.

8. The photoresist composition as claimed in claim 7, wherein the photo-initiator includes a compound represented by the following Chemical Formula 12

<Chemical Formula 12>

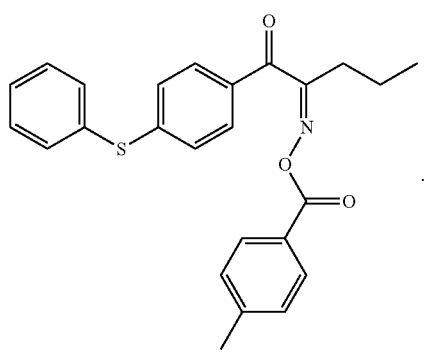

9. The photoresist composition as claimed in claim 1, further comprising about 1 to 50 part by weight of a multifunctional acrylate oligomer with respect to about 100 parts of the acryl-copolymer, the multifunctional acrylate oligomer including at least one selected from the group of an aliphatic urethane acrylate oligomer, an aromatic urethane acrylate oligomer, an epoxy acrylate oligomer, an epoxy methacrylate oligomer, a silicon acrylate oligomer, a melamine acrylate oligomer, and a dendritic acrylate oligomer.

10. A method of forming a thin film transistor substrate, the method comprising:

forming a thin film transistor on a base substrate;

coating a photoresist composition on the thin film transistor to form a photoresist layer;

exposing the photoresist layer to light; and developing the photoresist layer, wherein the photoresist composition includes about 100 parts by weight of an acryl-copolymer, about 0.1 to about 30 parts by weight of a photo-initiator, about 1 to about 50 parts by weight of a first acrylate monomer including at least five functional groups; and about 1 to about 50 parts by weight of a second acrylate monomer including at most four functional groups, and including at least one selected from the group of compounds represented by the following Chemical Formulas 1 to 4, <Chemical Formula 1>

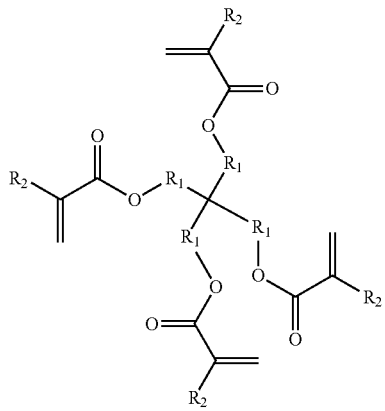

wherein, in Chemical Formula 1, $R_1$ independently represents a C2-C10 alkylene group, which has carbon atoms of 2 to 10, and $R_2$ independently represents a hydrogen atom or a C1-C10 alkyl group, <Chemical Formula 2>

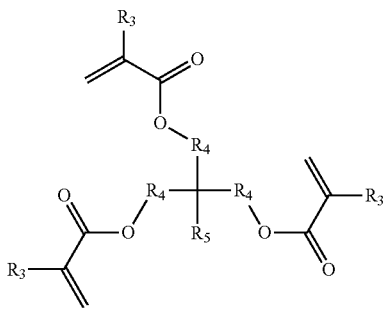

wherein, in Chemical Formula 2, $R_3$ independently represents a hydrogen atom or a C1-C10 alkyl group, $R_4$ independently represents a C2-C10 alkylene group, $R_5$ represents a hydroxymethyl group, a C3-C10 alkyl group or C3-C10 alkoxy group, <Chemical Formula 3>

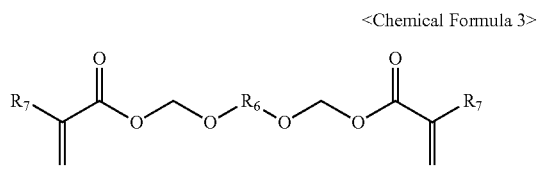

wherein, in Chemical Formula 3, $R_6$ represents a phenylene group, a tricyclodecylene group, an adamantylene group, a norboranylene group, a bisphenol-A group or a bisphenol-F group, and $R_7$ independently represents a hydrogen atom or a C1 to C10 alkyl group, <Chemical Formula 4>

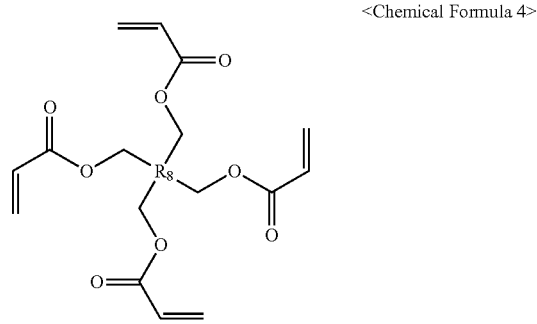

wherein, in Chemical Formula 4, $R_8$ represents a C2-C20 dialkyl ether group.

11. The method as claimed in claim 10, wherein the photoresist composition further comprises a solvent such that a solid content of the photoresist composition is about 10 to 50% by weight.

12. The method as claimed in claim 10, wherein the acryl-copolymer is prepared by copolymerizing monomers including an unsaturated olefin compound and an unsaturated carboxylic acid through a radical polymerizing reaction.

13. The method as claimed in claim 12, wherein a weight average molecular weight of the acryl-copolymer is about 3,000 to about 30,000.

14. The method as claimed in claim 10, wherein the first acrylate monomer includes at least one selected from the group of dipentaerythritol hexaacrylate, dipentaerythritol pentaacrylate, dipentaerythritol hydroxypentaacrylate, dipentaerythritol alkyloylpentaacrylate, and caprolactam-substituted dipentaerythritol hexaacrylate.

15. The method as claimed in claim 10, wherein the second acrylate monomer comprises at least one selected from the group of compounds represented by the following Chemical Formulas 6 to 8 and 10, <Chemical Formula 6>

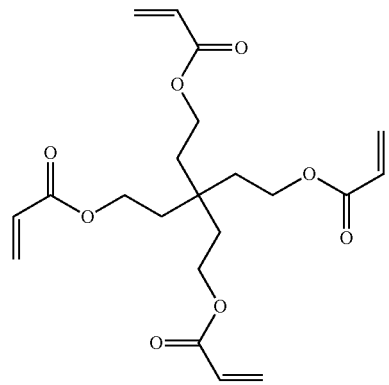

<Chemical Formula 7>

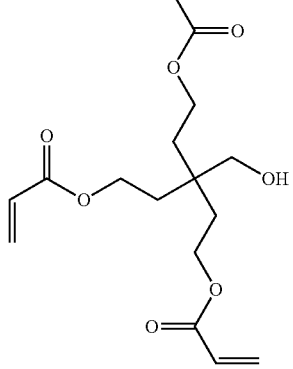

<Chemical Formula 8>

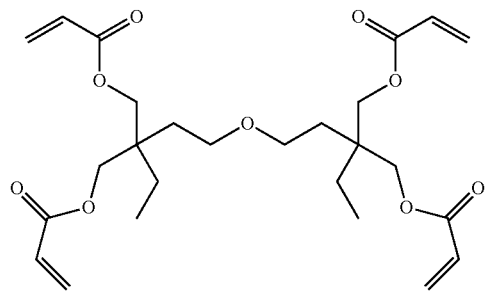

<Chemical Formula 10>

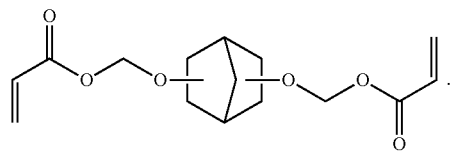

16. The method as claimed in claim 10, wherein the photo-initiator includes an oxime-ester compound.

17. The method as claimed in claim 16, wherein the photo-initiator includes a compound represented by the following Chemical Formula 12

<Chemical Formula 12>

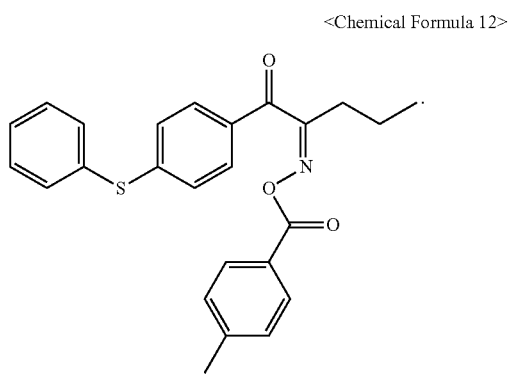 [SMILES: CCC/C(=N/OC(=O)c1ccc(C)cc1)C(=O)c1ccc(Sc2ccccc2)cc1]

18. The method as claimed in claim 10, wherein the photoresist composition further comprises about 1 to 50 part by weight of a multifunctional acrylate oligomer with respect to about 100 parts of the acryl-copolymer, the multifunctional acrylate oligomer including at least one selected from the group of an aliphatic urethane acrylate oligomer, an aromatic urethane acrylate oligomer, an epoxy acrylate oligomer, an epoxy methacrylate oligomer, a silicon acrylate oligomer, a melamine acrylate oligomer, and a dendritic acrylate oligomer.

19. The method as claimed in claim 10, wherein the base substrate is pre-baked at about 80° C. to about 120° C., before the photoresist layer is exposed to light.

20. The method as claimed in claim 10, wherein the base substrate is hard-baked at about 150° C. to about 250° C., after the photoresist layer is developed.

* * * * *